(12) United States Patent
Ding et al.

(10) Patent No.: US 7,470,863 B2
(45) Date of Patent: Dec. 30, 2008

(54) MICROELECTRONIC DEVICE WITH MIXED DIELECTRIC

(75) Inventors: Hanyi Ding, Essex Junction, VT (US); Brian P. Welch, Scotia, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 11/338,402

(22) Filed: Jan. 24, 2006

(65) Prior Publication Data
US 2007/0169959 A1   Jul. 26, 2007

(51) Int. Cl.
*H05K 1/16*   (2006.01)
(52) U.S. Cl. .................................. 174/260; 174/262
(58) Field of Classification Search .............. 174/260, 174/261–266
See application file for complete search history.

(56) References Cited

U.S. PATENT DOCUMENTS

| | | | | |
|---|---|---|---|---|
| 4,544,577 A | * | 10/1985 | May ............................ | 427/555 |
| 4,816,323 A | * | 3/1989 | Inoue .......................... | 428/210 |
| 5,576,518 A | * | 11/1996 | Shibuya et al. .............. | 174/264 |
| 6,545,640 B1 | * | 4/2003 | Herve et al. ........... | 343/700 MS |
| 7,297,878 B2 | * | 11/2007 | Kushitani et al. ........... | 174/264 |
| 2001/0011571 A1 | | 8/2001 | Farooq et al. ............. | 156/89.12 |
| 2002/0017399 A1 | | 2/2002 | Chang et al. ................ | 174/262 |
| 2003/0159262 A1 | | 8/2003 | Pasternak et al. ............. | 29/262 |
| 2003/0222314 A1 | | 12/2003 | Nair ............................ | 257/368 |
| 2004/0046235 A1 | | 3/2004 | Oprysko et al. ............. | 257/664 |

* cited by examiner

*Primary Examiner*—Ishwar (I. B.) Patel
(74) *Attorney, Agent, or Firm*—Schmeiser, Olsen & Watts; Rosa S. Yaghmour

(57) ABSTRACT

A microelectronic device and method of making the microelectronic device is provided. A dielectric substrate having first and second surfaces is provided. A first component, located in the dielectric substrate between the first and second surfaces of the dielectric substrate is formed. The first component includes a first interface and a second interface. A second component located in the dielectric substrate and spaced relative to the first component is formed, and a first low permittivity material is formed having a predetermined thickness and a first and second surface, the first surface of the low permittivity material is adjacent to or in contact with a first portion of the first interface of the first component. The first low permittivity material substantially reduces capacitive parasitics of the first component, resulting in a substantially higher characteristic impedance of the first component during operation of the microelectronic device.

11 Claims, 4 Drawing Sheets

MICROELECTRONIC DEVICE WITH MIXED DIELECTRIC

FIELD OF THE INVENTION

The invention relates to a microelectronic device for use in packaging semiconductors having mixed dielectric materials therein, more particularly to such packages where some of the conductors have increased characteristic impedance as a result of the mixed dielectric positioning within the package. A method of making the microelectronic device is also provided.

BACKGROUND OF THE INVENTION

In the electronics industry low signal impedance in interconnect structures, for example, in vias, is a concern.

In a microelectronic device, such as a ceramic flip-chip package, electrical performance of vias is becoming more and more significant to the overall signal integrity when the signal speed or frequency moves higher, as well as the die bonding pad pitch is reduced. This is mainly due to the discontinuity or the lower characteristic impedance of the vias. For high speed and RF signal applications, interconnects (traces: horizontal structures, vias: vertical structures) with characterization impedance of 50 Ohm (some RF applications also require 75 Ohm characterization impedance interconnects) are needed along the entire electrical pathway from one device to another. Via characterization impedance in a package depends on the distance between vias and the permittivity of the surrounding dielectric materials. The longer the distance and the lower the dielectric constant, the higher the characterization impedance.

A ceramic flip-chip package has a number of advantages, such as having a thermal coefficient of expansion close to the semiconductor material, a large number of the layers to accommodate more IOs and power structures, and lower signal loss for high speed applications. In ceramic flip-chip packages, in order to have a 50-Ohm characteristic impedance signal via, large signal via spacing is required due to the higher permittivity value of the ceramic. This design is not practical for dies with high density bonding pads and is against the trend of smaller die pad pitch for advance technologies (almost all new applications are migrating in the direction of smaller bonding pad pitch to save die area and lower cost). Changing to a lower permittivity dielectric package carrier may solve this characteristic impedance issue, but may introduce new electrical problems to the power structure and undesirably alter the loss, mechanical, density and thermal characteristics as compared to a ceramic substrate. Also the low permittivity substrate can be costlier and allow for fewer power, ground and signal layers.

There exists a need in the industry, therefore, for a structure which can obtain both a more desirable via characteristic impedance and retain the ceramic package benefits of allowing more IOs and power structures, better match of thermal coefficient of expansion to the die and lower signal loss.

OBJECTS AND SUMMARY OF THE INVENTION

Accordingly, it is the object of this invention to enhance the art of packaging technology.

It is another object of this invention to provide a low permittivity material adjacent to or in contact with a portion of a conductor to reduce capacitive parasitic of the conductor, resulting in a substantially higher characteristic impedance of the conductor during operation of a microelectronic device of which it is a part.

According to one aspect of the invention, there is provided a microelectronic device comprising a dielectric substrate having first and second surfaces, a first component, located in the dielectric substrate between the first and second surfaces of the dielectric substrate, having a first interface and a second interface, a second component located in the dielectric substrate and spaced relative to the first component, and a first low permittivity material having a predetermined thickness and a first and second surface, the first surface of the low permittivity material adjacent to a first portion of the first interface of the first component.

According to another aspect of the invention, there is provided a method of making a microelectronic device comprising the steps of providing a dielectric substrate having first and second surfaces, forming a first component, located in the dielectric substrate between the first and second surfaces of the dielectric substrate, having a first interface and a second interface, forming a second component located in the dielectric substrate and spaced relative to the first component, and forming a first low permittivity material having a predetermined thickness and a first and second surface, said first surface of said low permittivity material in contact with a first portion of the first interface of the first component.

The above objects, advantages, and features of the present invention will become more readily apparent from the following detailed description of the presently preferred embodiments as illustrated in the accompanying drawings.

BEST MODE FOR CARRYING OUT THE INVENTION

Figure 1A:
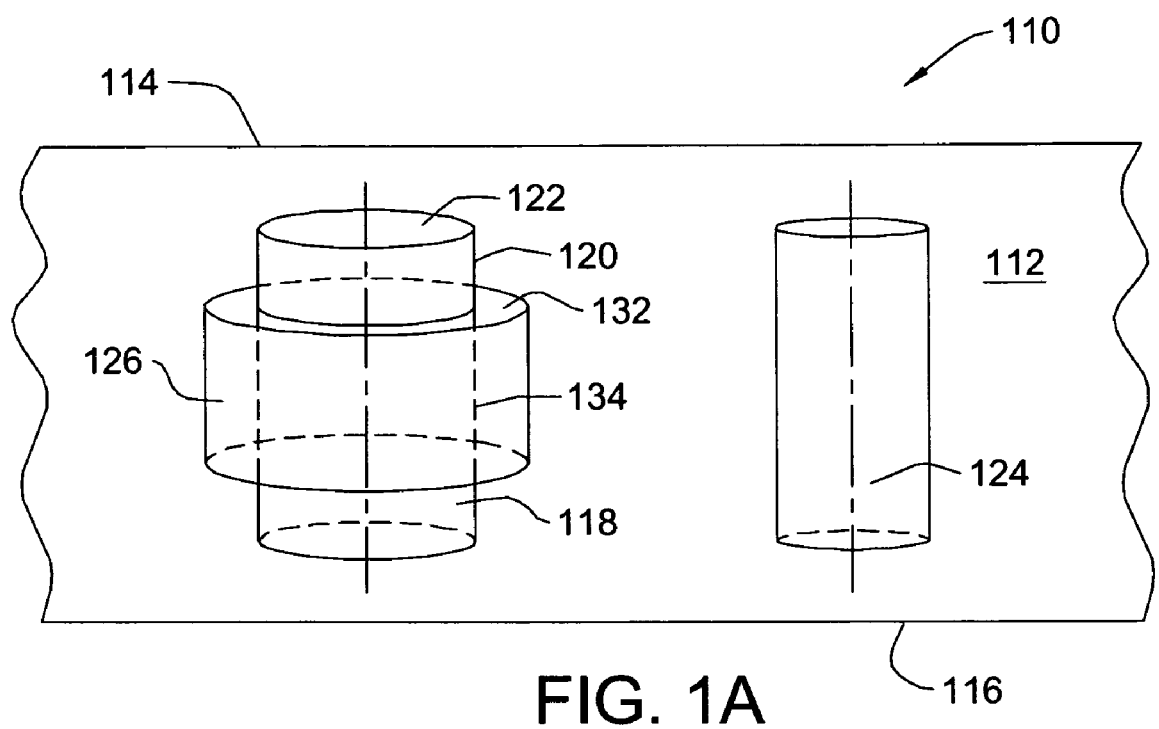
FIG. 1A illustrates a much enlarged view, in elevation, of one embodiment of a portion of the microelectronic device of the present invention.
Figure 1B:
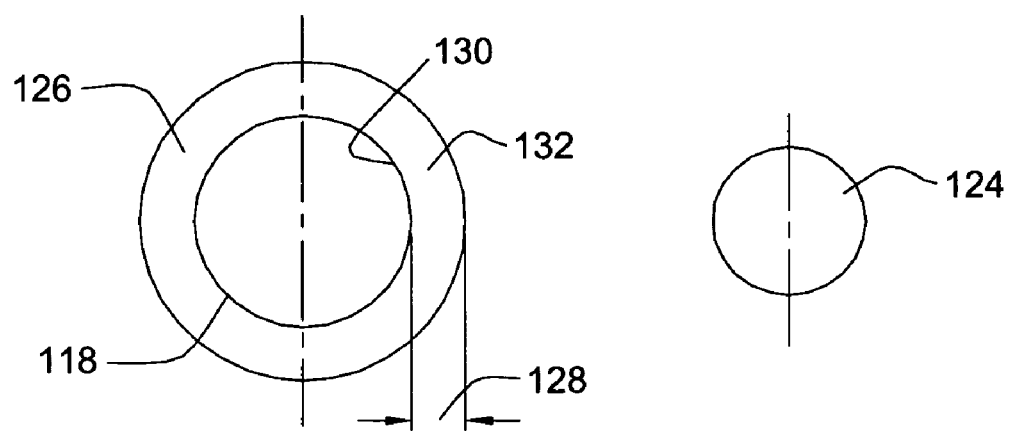
FIG. 1B illustrates a much enlarged top view of the microelectronic device of FIG. 1A.

A much enlarged view in elevation of a portion of a microelectronic device 110 for use with a semiconductor chip (not shown) illustrating one embodiment of the present invention is shown in FIG. 1A. Microelectronic device 110 includes a dielectric substrate 112 having first and second surfaces, 114 and 116, respectively. A first component 118 is located in dielectric substrate 112 between first surface 114 and second surface 116 of the dielectric substrate, having a first interface 120 and a second interface 122. A second component 124 is located in dielectric substrate 112 and spaced relative to first component 118. The spacing between first and second components can be from about 150 um to about 800 um. A first low permittivity material 126 having a predetermined thickness 128 (see FIG. 1B) includes a first surface 130 and a second surface 132, the first surface of the low permittivity material is adjacent to or in contact with a first portion 134 of first interface 120 of first component 118. Adjacent to can be defined as less than about 100 um from first portion 134 of first interface 120. Permittivity is a characteristic of space or material. Relative permittivity of a material or space, also called the dielectric constant, is the ratio of the permittivity of a space or material, to the permittivity of vacuum space. Relative permittivity is a way to characterize the reduction in effective electric field because of the polarization of the dielectric. A low permittivity material is defined as a material having a relative permittivity value less than about 4.

Dielectric substrate 112 can be a material selected from the group consisting of ceramic such as alumina ceramic. First component 118 and second component 124 are both comprised of an electrically conductive material selected from the group consisting of copper, tungsten and aluminum. The shape of first component 118 preferably is substantially the shape of a cylinder. First component 118 serves the function of an internal or through signal via to carry signals to and from a semiconductor chip which can be mounted on the microelectronic device. Other conductor shapes are possible as required by the individual microelectronic device design. For example, the shape of a square, rectangle or ellipse is possible. The cylinder can have a radius of from about 25 micrometers (um) to about 300 um and the exterior surface of the cylinder is defined as first interface 120 of first component 118. The minimum size of the cylinder is limited by the process technology used in manufacturing. Smaller size cylinders can allow more circuitry in a given area (i.e. more IOs), but the size of any cylinder is limited the maximum current allowed for the cylinder. A larger cylinder takes up more area so limiting IOs in a given area. The substrate size, IO number needed and the spacing between cylinders determines how large a cylinder size can be.

First low permittivity material 126 can form substantially the shape of a ring around first component 118. First low permittivity material 126 can be selected from the group consisting of polytetrafluoroethylene, fluorinated silica glass, and polytetrafluoroethylene based dielectric materials. First low permittivity material 126 can be in a solid state, an expanded state or a foam. First low permittivity material 126 functions to substantially reduce capacitance parasitics of first component 118 during operation of microelectronic device 110 resulting in substantially higher characteristic impedance of the first component. The thickness of first low permittivity material 126 can be between about 25 um and about 600 um. The characteristic impedance (Z0) of an interconnect (such as first component 118) is defined by its equivalent inductance "L" and capacitance "C", $Z0=\sqrt{L/C}$. Both inductance and capacitance are measures of how the interconnection of first component 118 behaves electrically under certain surrounding conditions from circuit-component-point of view. The equivalent "L" and "C" of an interconnect are called parasitic inductance and capacitance because these interconnects are not designed to be inductors or capacitors. Any interconnect with a non-zero physical size acts to a signal as an equivalent "L" or "C" network. Parasitic inductance is determined by the interconnect size, the distance to other interconnects (such as second component 124) and ground, and also on the permittivity of the material near or around it. For a given size and relative location of an interconnect (such as first component 118), the lower the permittivity, the lower the parasitic capacitance and then the higher the characteristic impedance. During design of a microelectronic device adding a low permittivity ring, for example, ring 126 to first component 118, provides the function of lowering the parasitic capacitance of the first component, while necessitating no size or distance changes to other interconnects (such as to second component 124). The thickness of the ring 126 determines the size of the reduction of the parasitic capacitance of the first component 118, so varying the thickness of ring 126 can be used to tune the characteristic impedance of the first component 118 to the desired value. Interconnects (such as the second component 124) can be other signal, power supply, or ground connections. Relative to first component 118, the existence of second component 124 will affect the parasitic inductance and capacitance of the first component. The shorter the distance between first component 118 and second component 124, the lower the parasitic inductance and the higher the parasitic capacitance of the first component, which results in the lower the characteristic impedance of the first component. For example, in a 225 um pitch (the center to center distance between two adjacent vias) microelectronic device having a ceramic dielectric material, (with dielectric relative permittivity of 9.6), first component 118 with radius of 50 um surrounded by 8 other components in a square grid has a characteristic impedance of about 32 ohms, if no low permittivity ring 126 is used. When low permittivity material 126 is added to first component 118, as a ring having a relative permittivity of 2.5, the characteristic impedance of the first component becomes about 50 ohm. Ring 126 can encompass the entire first interface 120 of first component 118 so that first portion 134 is equal to about 100% of the area of the first interface of the first component.

Figure 2A:
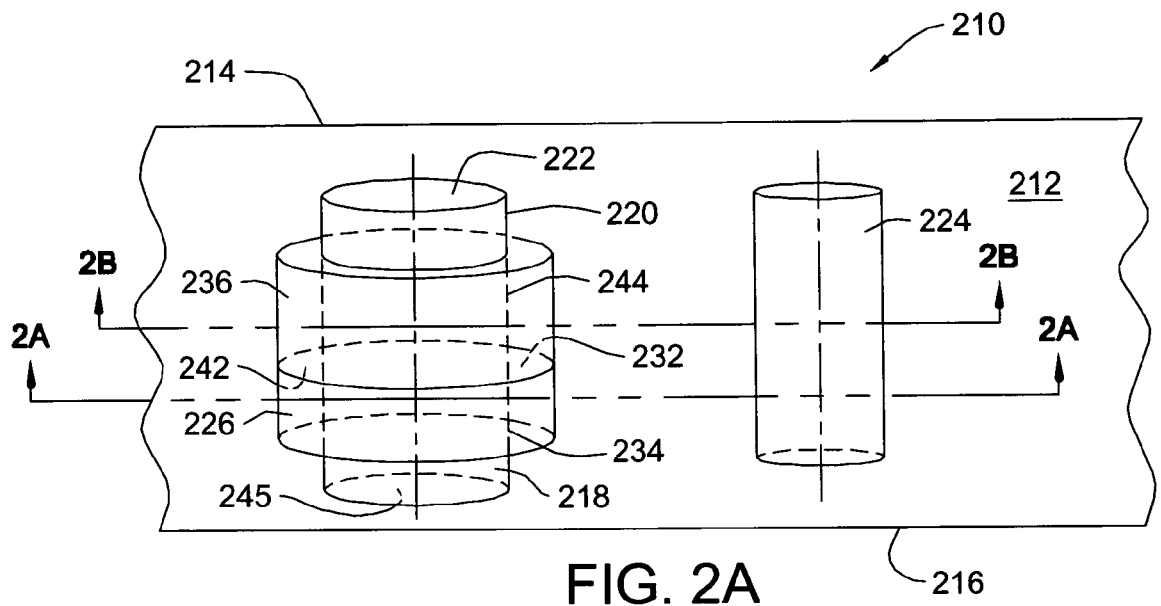
FIG. 2A illustrates a much enlarged view, in elevation, of another embodiment of a portion of the microelectronic device of the present invention.
Figure 2B:
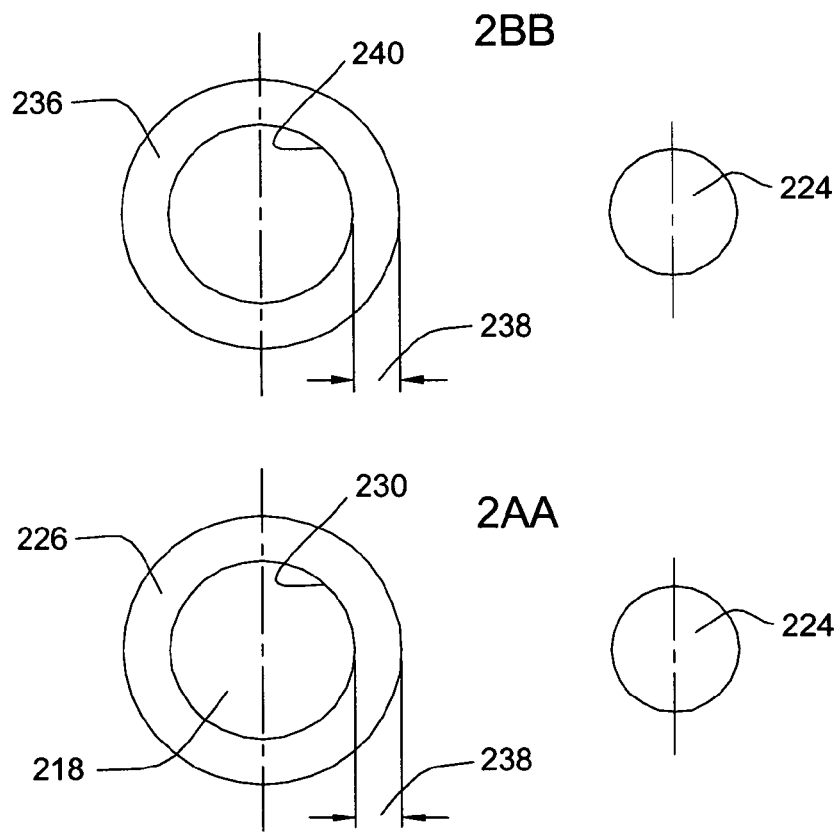
FIG. 2B illustrates a much enlarged bottom views of the microelectronic device of FIG. 2A taken along line 2A-2A in FIG. 2A, and taken along line 2B-2B in FIG. 2A.

A much enlarged view in elevation of a portion of a microelectronic device 210 for use with a semiconductor chip (not shown) illustrating another embodiment of the present invention is shown in FIG. 2A. Microelectronic device 210 includes a dielectric substrate 212 having first and second surfaces, 214 and 216, respectively. A first component 218 is located in dielectric substrate 212 between first surface 214 and second surface 216 of the dielectric substrate, having a first interface 220 and a second interface 222. A second component 224 is located in dielectric substrate 212 and spaced relative to first component 218. First component 218 is substantially the shape of a cylinder and serves the function of an internal or through signal via to carry signals to and from a semiconductor chip which can be mounted on the microelectronic device. Other conductor shapes are possible as required by the individual microelectronic device design. A first low permittivity material 226 having a predetermined thickness 228 (see FIG. 2B-2AA) includes a first surface 230 and a second surface 232, the first surface of the low permittivity material is adjacent to or in contact with a first portion 234 of first interface 220 of first component 218. Adjacent to can be defined as less than about 100 um from first portion 234 of first interface 220. First low permittivity material 226 is selected from a group consisting of polytetrafluoroethylene, fluorinated silica glass, and polytetrafluoroethylene based dielectric materials. First low permittivity material 226 can be in a solid state, an expanded state or a foam. First permittivity material 226 forms substantially the shape of a ring around first component 218. A second low permittivity material 236, having a predetermined thickness 238 (see FIG. 2B-2BB) includes a first interface 240 and a second interface 242, is adjacent to or in contact with a second portion 244 of first component 218. Adjacent to can be defined as less than about 100 um from second portion 244 of first interface 220. Second low permittivity material 236 forms substantially the shape of another ring around first component 218. Second low permittivity material 236 is selected from a group consisting of polytetrafluoroethylene, fluorinated silica glass, and polytetrafluoroethylene based dielectric materials. Second interface 242 of second low permittivity material 236 is in contact with second interface 232 of first low permittivity material 226, the first low permittivity material 226 and the second low permittivity material mutually lower the capacitance parasitics of first component 218 resulting in higher characteristic impedance of the first component. First and second low permittivity rings 226 and 236, respectively, can be selected to have different permittivity values and thicknesses. As described in the first embodiment, this can result in different parasitic capacitance for the portions of first component 218 surrounded by these rings, further resulting in different characteristic impedances for the corresponding portions of the first component. By selecting the permittivity values and the thicknesses 228 and 238 for the rings 226 and 236, certain characteristic impedances for portions 234 and 244 can be obtained. This selection can be used to lower the discontinuities at the ends of first component 218. For example, in a case in which the first component 218 is connected on one end to a circuit having a characteristic impedance of 100 ohms at second interface 222 and on the other end to a circuit having characteristic 50 ohms at an interface 245, first low permittivity material 226 can be selected so that first portion 234 can have a 65 ohm characteristic impedance and second low permittivity material 236 can be selected so that second portion 244 can have a characteristic impedance of 85. The characteristic impedance that the circuit having a 100 ohm impedance is now connected to first component 218 having a characteristic of 85 rather than being connected to a circuit having a characteristic of impedance of 50 (if first component 218 had no low permittivity rings therearound). The effect is first component 218 smoothing the transition between the two ends. In another words, the discontinuity between the two ends is lowered. The size of second component 224 and its distance from first component 218 affects the parasitic inductance and capacitance of the first component. Second low permittivity ring 236 has a thickness of from about 25 um to about 600 um. The minimum thickness of the ring 236 is limited by process technology used to manufacture the ring, while the maximum thickness is limited by the distance between the first and second components. Second component 224 comprises substantially the shape of a cylinder.

Figure 3A:
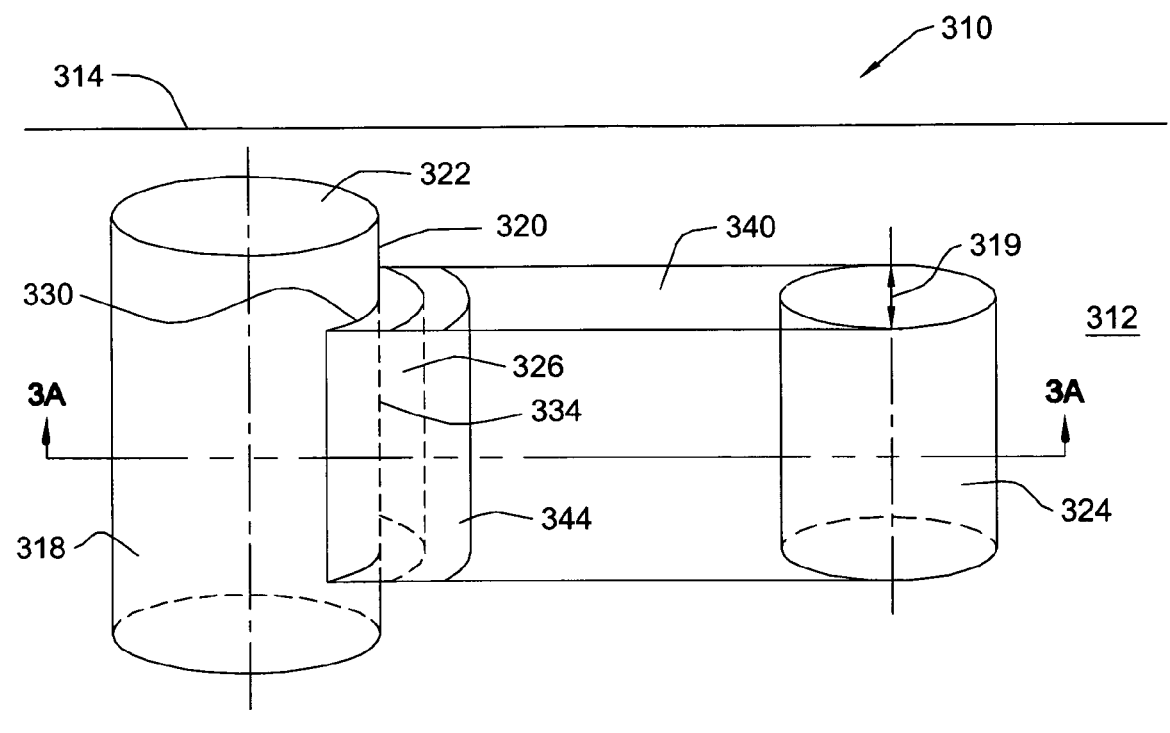
FIG. 3A illustrates a much enlarged view, in elevation, of yet another embodiment of a portion of the microelectronic device of the present invention.
Figure 3B:
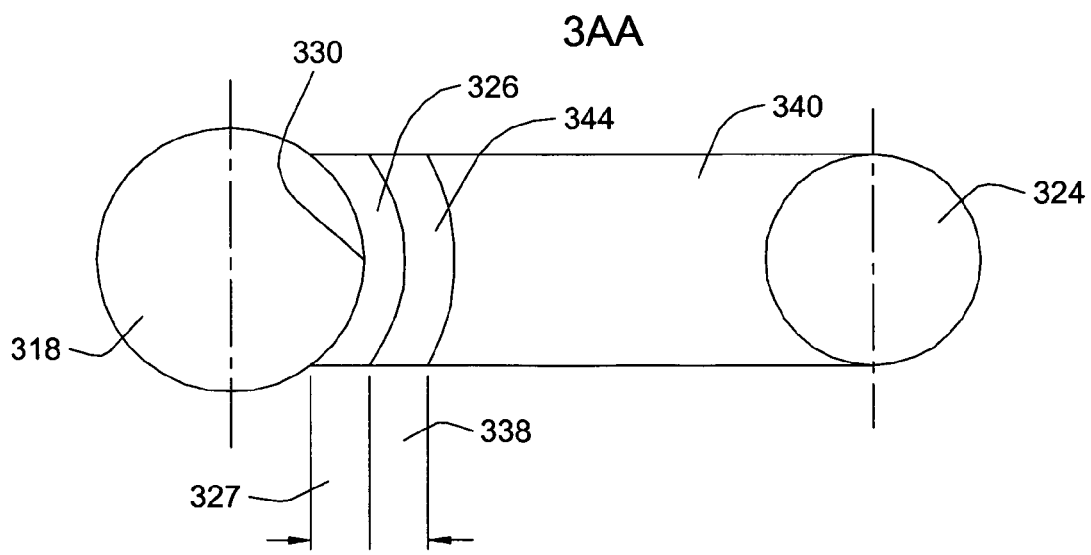
FIG. 3B illustrates a much enlarged bottom view of the microelectronic device of FIG. 3A taken along line 3A-3A in FIG. 3A.

A much enlarged view in elevation of a portion of a microelectronic device 310 for use with a semiconductor chip (not shown) illustrating yet another embodiment of the present invention is shown in FIG. 3A. Microelectronic device 310 includes a dielectric substrate 312, having first and second surfaces 314 and 316, respectively. A first component 318 is located in dielectric substrate 312 between first surface 314 and second surface 316 of the dielectric substrate, having a first interface 320 and a second interface 322. A second component 324 is located in dielectric substrate 312 and spaced relative to first component 318. Second component 324 has a diameter 319, ranging from about 50 um to about 600 um. The process technology limits the minimum diameter, the density of interconnect design and the cost limits the maximum diameter. A first low permittivity material 326 having a predetermined thickness 327 (see FIG. 3B) includes a first surface 330, the first surface of the first low permittivity material is adjacent to or in contact with a first portion 334 of first interface 320 of first component 318. Adjacent to can be defined as less than about 100 um from first portion 334 of first interface 320. First portion 334 of first interface 320 comprises a projection 340 of diameter 319 of second component 324 onto the first interface of the first component. First permittivity material can be further defined by a stack of at least two low permittivity materials 326 and 344. In the stack one of the low permittivity materials, a first low permittivity material, is selected from the group consisting of polytetrafluoroethylene, fluorinated silica glass, and polytetrafluoroethylene based dielectric materials. The other low permittivity material in the stack is selected from the same group however, the other low permittivity material has a permittivity value above that of the first low permittivity material. First low permittivity material 326 and other low permittivity material 344 can each be in a solid state, an expanded state or a foam. The low permittivity stack between the first component 318 and the second component 324 lowers the parasitic capacitance between them and then lowers the coupling between them.

Figure 4:
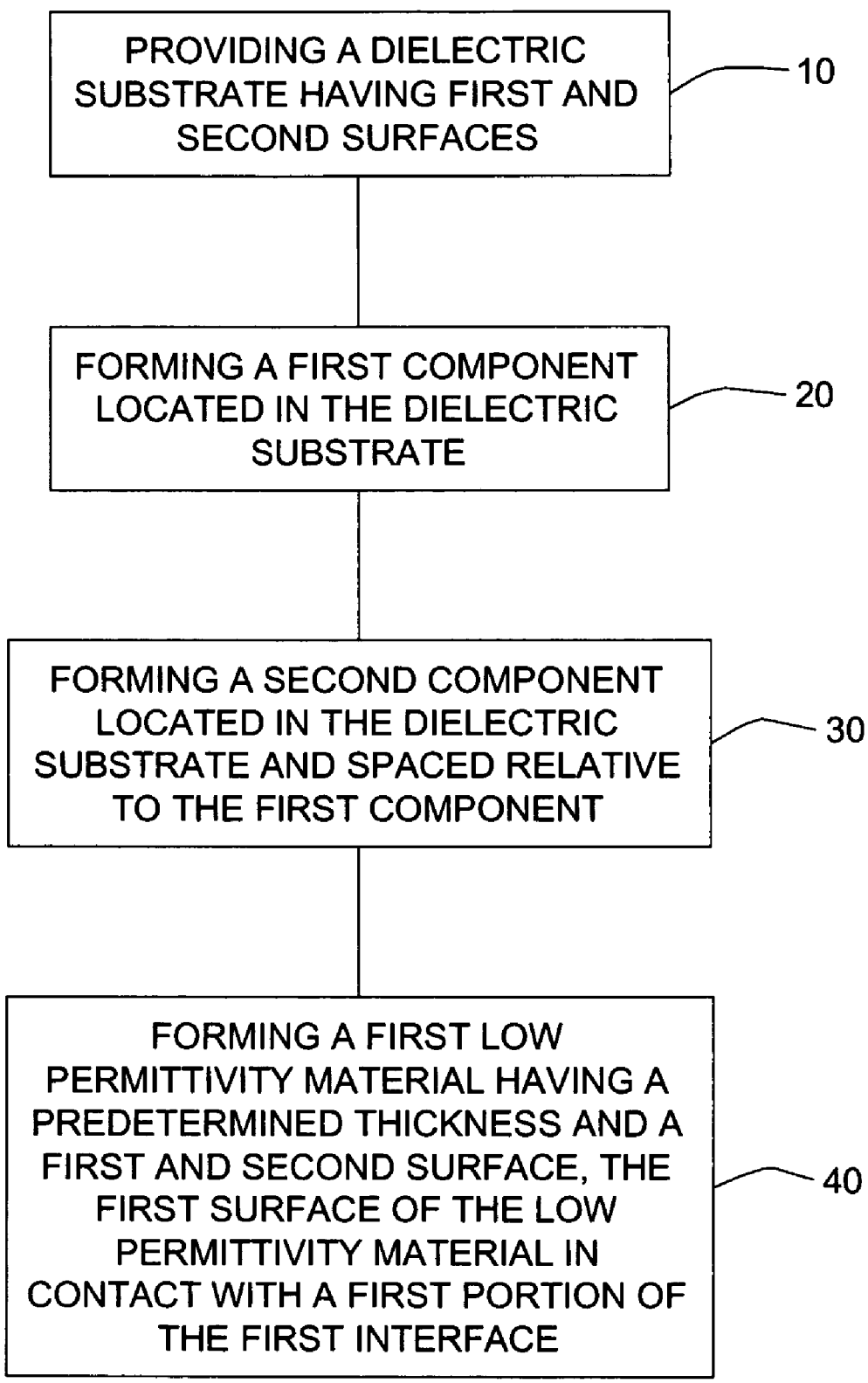
FIG. 4, illustrates a flow diagram of the steps carried out in making a microelectronic device, in accordance with one embodiment of the present invention.

FIG. 4 illustrates the various steps involved in making a microelectronic device according to one aspect of the present invention. As depicted in Block 10, a dielectric substrate is provided. The dielectric substrate includes first and second surfaces.

As depicted in Block 20, a first component is formed in the dielectric substrate between the first and second surfaces. The first component has a first interface and a second interface.

Block 30 describes the step of forming a second component in the dielectric substrate spaced relative to the first component.

As depicted in Block 40 a first low permittivity material with a predetermined thickness and a first and second surface is formed, the first surface of the low permittivity material in contact with a first portion of the first interface of the first component. The step of forming the first low permittivity material in contact with a portion of the first interface of the first component includes the step of forming at least one through hole in the dielectric substrate, forming the first low permittivity material in at least a portion of the through hole, drilling a through hole in the first low permittivity material and filling the through hole in the dielectric substrate and the through hole in the first permittivity material with a conductive material to form the first component. The hole can be punched, drilled, or laser drilled, depending on the sizes. First drilling forms the hole in the low permittivity material. The second drilling is for the first component, which can be formed after the filling and polishing of the low permittivity material. The step of forming the first low permittivity material comprises the step of chemical vapor deposition. Alternatively, forming the first low permittivity material can be accomplished by the step of crystal growth.

While there have been shown and described what the present considered preferred embodiments of the invention, it will be obvious to those skilled in the art that various changes and modifications may be made therein without departing from the scope of the invention as defined by the appended claims.

What is claimed is:

1. A microelectronic device comprising:
a dielectric substrate having first and second surfaces;
a first component consisting of a first cylinder, said first component located in the dielectric substrate between the first and second surfaces of the dielectric substrate, said first component having a top planar surface, a bottom planar surface, and an external surface disposed between and in direct physical contact with the top planar surface and the bottom planar surface, said top planar surface and bottom planar surface each being normal to an axis of the first cylinder, said axis being oriented in an axial direction, each point on the external surface disposed at a same distance from said axis, said first component comprising a first electrically conductive material;

a second component located in the dielectric substrate and spaced apart from the first component, said second component consisting of a second cylinder, said second component comprising a second electrically conductive material; and a low permittivity material in contact with the external surface only at a first portion of the external surface, and wherein the first portion of the external surface subtends a first angle with the axis of the first cylinder such that the first angle is less than 360 degrees.

2. The microelectronic device of claim 1,
wherein the low permittivity material comprises a first low permittivity material having a first permittivity value and a second low permittivity material having a second permittivity value that is greater than the first permittivity value,
wherein the first low permittivity material is in contact with the external surface only at the first portion of the external surface, and
wherein the second low permittivity material is in contact with the first low permittivity material and is disposed between the first low permittivity material and the second component.

3. The microelectronic device of claim 2, wherein the first low permittivity material is in contact with the external surface only at the first portion of the external surface.

4. The microelectronic device of claim 2, wherein the first low permittivity material is adjacent to the external surface only at the first portion of the external surface.

5. The microelectronic device of claim 2, wherein the axis of the first cylinder and an axis of the second cylinder are parallel to each other and oriented in the axial direction.

6. The microelectronic device of claim 5,
wherein a top surface of the first low permittivity material, a top surface of the second low permittivity material, and a top surface of the second cylinder are coplanar in a top plane that is normal to the axial direction, and
wherein a bottom surface of the first low permittivity material, a bottom surface of the second low permittivity material, and a bottom surface of the second cylinder are coplanar in a bottom plane that is normal to the axial direction.

7. The microelectronic device of claim 5,
wherein a first side surface of the first low permittivity material and a first side surface of the second low permittivity material are coplanar in a first plane that is parallel to the axial direction and tangent to the second cylinder, and
wherein a second side surface of the first low permittivity material and a second side surface of the second low permittivity material are coplanar in a second plane that is parallel to the axial direction and tangent to the second cylinder.

8. The microelectronic device of claim 2, wherein an inner surface of the first low permittivity material is in contact with or adjacent to the external surface only at the first portion of the external surface,
wherein an outer surface of the first low permittivity material is in contact with the second low permittivity material at an inner surface of the second low permittivity material,
wherein the inner surface of the first low permittivity material subtends a second angle with an axis of the first cylinder,
wherein the outer surface of the first low permittivity material and the inner surface of the second low permittivity material subtend a third angle with the axis of the first cylinder,
wherein an outer surface of the second low permittivity material subtends a fourth angle with the axis of the first cylinder,
wherein the first angle is equal to the second angle if the first low permittivity material is in contact with the external surface only at the first portion of the external surface,
wherein the first angle is greater than the second angle if the first low permittivity material is adjacent to the external surface only at the first portion of the external surface,
wherein the second angle is greater than the third angle, and
wherein the third angle is greater than the fourth angle.

9. The microelectronic device of claim 8, wherein the first low permittivity material is in contact with the external surface only at the first portion of the external surface.

10. The microelectronic device of claim 8, wherein the first low permittivity material is adjacent to the external surface only at the first portion of the external surface.

11. The microelectronic device of claim 1, wherein the second cylinder comprises a diameter between about 50 micrometers and about 600 micrometers.

* * * * *